United States Patent
Trunk et al.

(10) Patent No.: US 9,231,586 B2
(45) Date of Patent: Jan. 5, 2016

(54) INDUCTIVE PROXIMITY OR DISTANCE SENSOR

(75) Inventors: Lothar Trunk, Weibersbrunn (DE); Alan Lowell Houp, Frankfurt am Main (DE)

(73) Assignee: DIEHL AEROSPACE GMBH, Ueberlingen (DE)

( * ) Notice: Subject to any disclaimer, the term of this patent is extended or adjusted under 35 U.S.C. 154(b) by 157 days.

(21) Appl. No.: 13/449,812

(22) Filed: Apr. 18, 2012

(65) Prior Publication Data
US 2012/0268110 A1 Oct. 25, 2012

(30) Foreign Application Priority Data

Apr. 19, 2011 (DE) .......................... 10 2011 018 167

(51) Int. Cl.
*G01B 7/14* (2006.01)
*H03K 17/95* (2006.01)

(52) U.S. Cl.
CPC .......... *H03K 17/9505* (2013.01); *H03K 17/952* (2013.01)

(58) Field of Classification Search
CPC .......... H03K 17/9502; H03K 17/9505; H03K 2017/9527; H03K 17/952; G01B 7/023; G01B 7/003; G01B 7/14; Y10T 29/49073; Y10T 29/49002; Y10T 29/49007; Y10T 29/4902; H01F 21/06; H01F 27/306

USPC .......... 324/207.26, 207, 207.15, 207.16, 654; 29/595, 592.1, 602.1

See application file for complete search history.

(56) References Cited

U.S. PATENT DOCUMENTS

| 5,278,496 A * | 1/1994 | Dickmeyer et al. ........... 324/174 |
| 6,236,200 B1 | 5/2001 | Nekado et al. |
| 6,507,189 B2 * | 1/2003 | Woolsey et al. ......... 324/207.26 |
| 6,801,113 B2 * | 10/2004 | Nakazaki et al. ............. 336/198 |
| 7,360,294 B2 * | 4/2008 | LaClair et al. .................. 29/595 |
| 2001/0019262 A1 | 9/2001 | Woolsey et al. |
| 2006/0103372 A1 | 5/2006 | LaClair |

FOREIGN PATENT DOCUMENTS

| DE | 103 28 122 A1 | 1/2004 |
| DE | 601 00 669 T2 | 7/2004 |
| DE | 11 2008 002 534 T5 | 8/2010 |
| DE | 10 2009 037 808 A1 | 3/2011 |

* cited by examiner

*Primary Examiner* — Arleen M Vazquez
*Assistant Examiner* — Neel Shah
(74) *Attorney, Agent, or Firm* — Scully Scott Murphy and Presser

(57) ABSTRACT

The invention relates, in particular, to an inductive proximity or distance sensor. The invention proposes that a core 9 of an inductive sensor unit 5 of the proximity sensor 1, which projects into a coil carrier 7, have a rectangular cross-sectional profile.

18 Claims, 10 Drawing Sheets

INDUCTIVE PROXIMITY OR DISTANCE SENSOR

Figure 1:
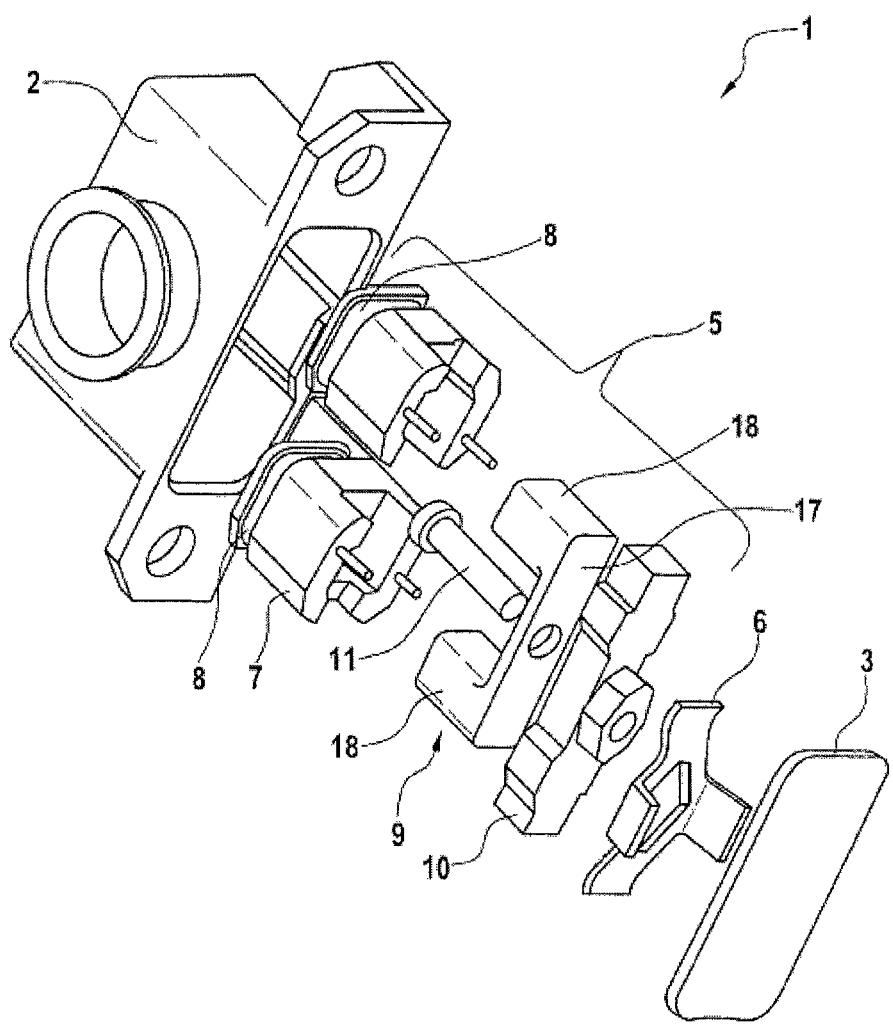

The invention relates, in particular, to an inductive proximity or distance sensor. Such sensors are known, for example, from DE 1 03 28 122 A1 or DE 102009037808 A1.

When using such proximity or distance sensors in safety-critical areas, a high degree of accuracy is required, in particular in the case of changing overall circumstances, for example temperature fluctuations and the like.

The known designs and constructions admittedly have thoroughly satisfactory degrees of accuracy. Irrespective of this, there is nevertheless room for additional improvements for increasing the accuracy and reliability.

On the basis of this, an object of the present invention is to improve the systems known according to the prior art. The intention is, in particular, to specify a sensor, in particular a proximity or distance sensor, which has improved sensitivity, accuracy and reliability and—inter alia—can also be produced in a comparatively simple and cost-effective manner.

This object is achieved by the features of the independent claim. Refinements emerge from the dependent claims.

Independent Patent Claim 1 proposes a sensor having an inductive sensor unit which has at least one coil carrier, with a coil winding situated thereon for generating a magnetic field, and at least one core.

In this case, the coil winding extends in the axial direction directly adjacent to a first axial contact surface of the coil carrier. The first axial contact surface may be formed, for example, by a flange-like projection or by an incision in the coil former, which incision leads to a flange-like projection.

The coil winding advantageously extends in the axial direction of the coil carrier as far as a further axial contact surface, which means that the coil winding extends between the first axial contact surface and the further axial contact surface. As a result of the design, the core can and will usually extend over the further axial contact surface.

The cross section of the coil carrier as such may be round, oval, square, rectangular, etc. Plastics, for example PEEK, are particularly suitable as the material for the coil former.

The core is at least partially arranged in a recess in the coil carrier in a concentric manner and in such a manner that it overlaps the coil winding. Concentric is intended to mean, in particular, that the core is in the centre or middle of the coil formed by the coil winding. The recess is preferably adapted to the outer dimensions and the outer shape of that section of the core which projects into the recess.

The core rests against a second axial contact surface which is substantially coplanar with respect to the first axial contact surface. As a result of the fact that the first and second axial contact surfaces are coplanar, it is possible to avoid the relative position of those ends of the coil winding and core which rest against corresponding axial contact surfaces being changed as a result of temperature fluctuations. This makes it possible to obtain a sensor which is comparatively insensitive to temperature fluctuations.

In the proposed sensor, at least one core section which overlaps the coil winding has a rectangular cross-sectional profile. It has surprisingly been found that a particularly high degree of accuracy and reliability can be achieved with such a cross-sectional profile.

The wording "a core section which overlaps the coil winding" is intended to be understood as meaning, in particular, a section of the core which, located in the recess, axially extends away from the plane of the first axial contact surface over the axial extent of the coil winding. In other words, the core section is inside the coil formed by the coil winding.

The shape of the turns or windings of the coil results from the corresponding shape of the coil carrier. The latter may have, in particular, a circular, oval, polygonal, square, rectangular etc. cross section in the region of the coil winding. Corners or edges of the coil carrier are preferably rounded in the region of the coil winding, with the result that damage to the coil material, that is to say the winding wire, can be avoided.

The core may be produced from a metal, in particular from Mu-metal or Permalloy. The coil material, in particular the winding wires for the coil, may be produced from copper or a copper alloy.

According to one variant, the cross-sectional profile of at least one core section is a solid profile. That is to say the core has at least one core section which is produced from solid material. Particularly advantageous sensitivity of the sensor results for a solid profile.

According to another variant, the cross-sectional profile of at least one core section of the core is a closed or open hollow profile. Cores with open or closed hollow profiles can be produced in a comparatively simple manner and with comparatively low costs from a sheet metal-like raw material, for example by sheet metal forming.

An open hollow profile may be formed, for example, by a material section of the core which is bent in a U-shaped manner. In the case of an overall U-shaped core with two limbs and a base running between the limbs, the base may be designed as a planar connecting web and the limbs may be designed as U-profiles with openings which face one another. Hollow profiles have the advantage that the weight of the overall sensor can be considerably reduced. Rectangular hollow profiles enable thoroughly sufficient sensor accuracies and reliabilities.

According to one particularly preferred variant, the core is pressed onto the second axial contact surface by a force, preferably an elastic force, preferably a spring force. This makes it possible to avoid stresses and tensions which would otherwise be caused by different coefficients of expansion of the core and coil carrier in the event of temperature fluctuations with other types of fastening.

According to another variant, the core is designed as a U-core. In the case of a U-core with two limbs and a base connecting the limbs, each limb is at least partially arranged in a recess in a respective coil carrier in such a manner that the respective limb is concentric, that is to say in the middle or central, with respect to the coil winding and overlaps the coil winding.

In the case of a U-core, the base can be designed as a type of base plate from which the limbs project in the same direction. Pressing the core onto the second axial contact surfaces means in this case that the limbs, more precisely ends of the limbs which face away from the base, are pressed onto the second axial contact surface. For this purpose, a force, in particular an elastic force, in particular a spring force, can be applied to the base itself.

According to another variant, the core, in particular the U-core, is held using a holding element which can be detachably connected, in particular latched, to the at least one coil carrier. The holding element can be situated, for example, on a side of the coil carrier facing away from the first and second axial contact surfaces. Fastening means for the holding element, for example snap-action elements and the like, which enable particularly simple assembly, in particular, can accordingly be provided.

In particular, it is possible for a force which presses the core or the limbs into respective recesses or onto the respective second axial contact surfaces to be generated by the holding element and/or by an elastic force which is applied to the holding element, in particular a spring force, in particular a force which presses the holding element against the at least one coil carrier. The core and the coil carrier can be connected to one another in a sufficiently firm manner, on the one hand, by resiliently or elastically pressing the core onto the respective second axial contact surfaces. On the other hand, the connection between the core and the coil carrier is sufficiently elastic, with the result that stresses and tensions caused by different coefficients of thermal expansion can be avoided in a wide temperature range.

A spring force which presses the core or the limbs in the direction of the respective second axial contact surface can be generated, for example, by a spring which is included in the sensor and directly applies a spring force to the holding element and thus indirectly applies a spring force to the core connected downstream of the holding element.

According to another variant, the sensor also has a housing in which the at least one coil carrier and core are accommodated. The housing is preferably designed in such a manner that the spring which can be used to apply spring force to the holding element is supported on the holding element, on the one hand, and on the housing, on the other hand.

According to yet another variant, the at least one coil carrier has an axial end face which faces away from the recess and is pressed against an inner wall of the housing, preferably by the spring. As a result, the core can be pressed in the direction of the coil carrier and thus the coil carrier can be pressed in the direction of the housing inner wall in a simple manner and, in particular, by means of a single spring. This is particularly advantageous with regard to different changes in the length of the housing, coil carrier and core in the event of temperature changes. It is also possible to achieve the situation in which the housing inner wall and the axial end face as well as the end face of the limbs and the second axial contact surface always rest against one another without play and without a gap.

Overall, it is shown that the proposed sensor which can be used as a distance or proximity sensor can be produced in a comparatively simple and cost-effective manner. Furthermore, the sensor can be produced in an automated manner, in particular in mass production. In addition, the proposed sensor has an advantageous degree of accuracy and reliability.

Figure 2:
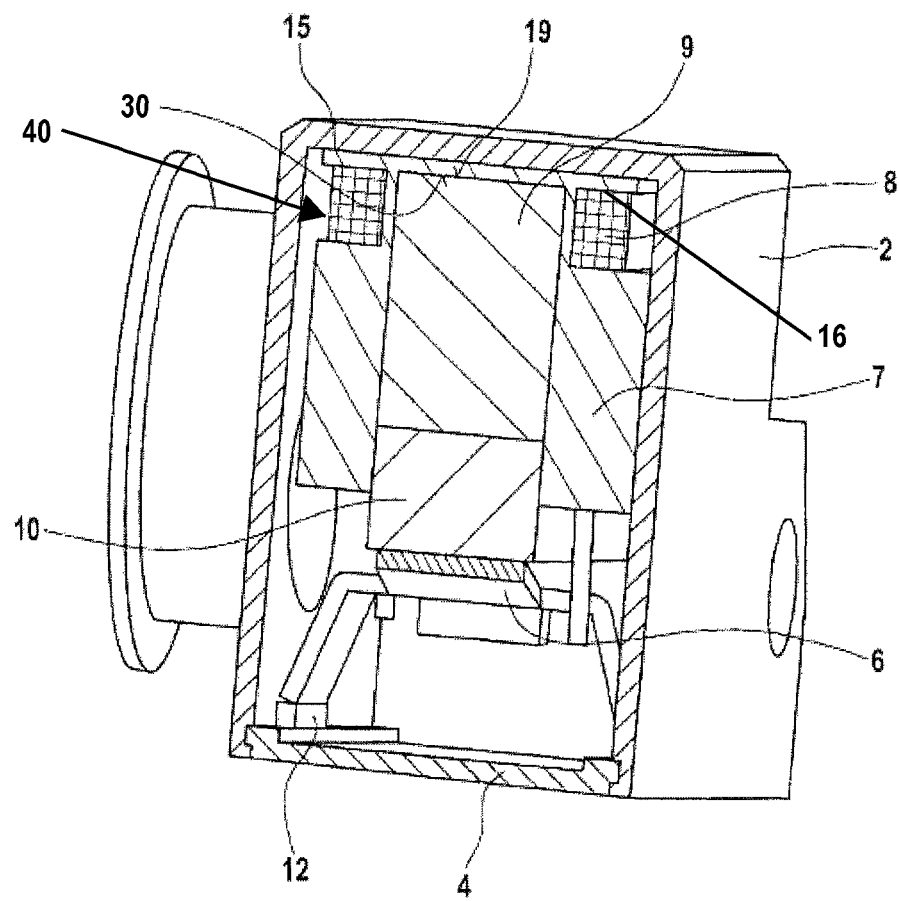
Figure 3:
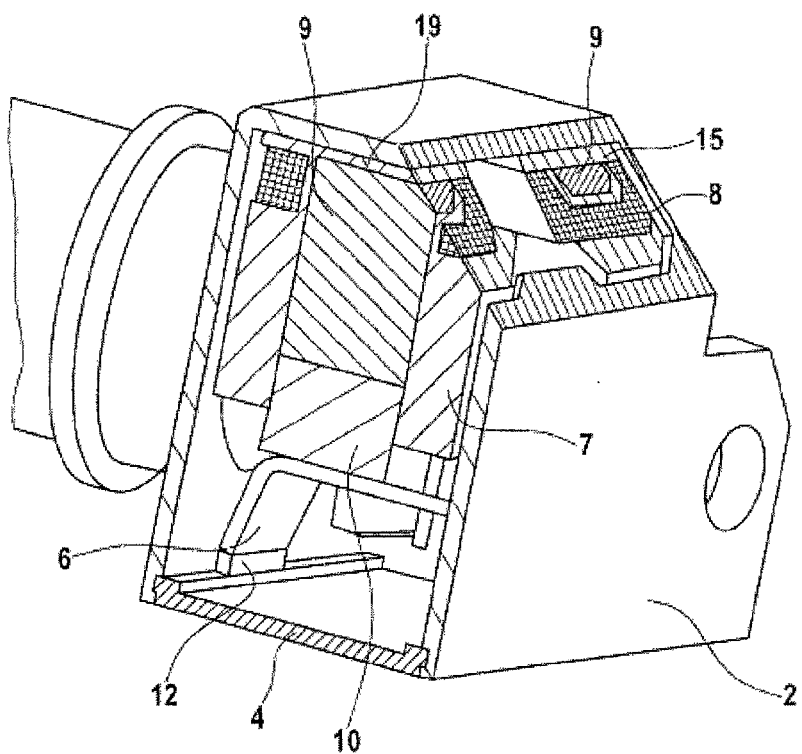
Figure 4:
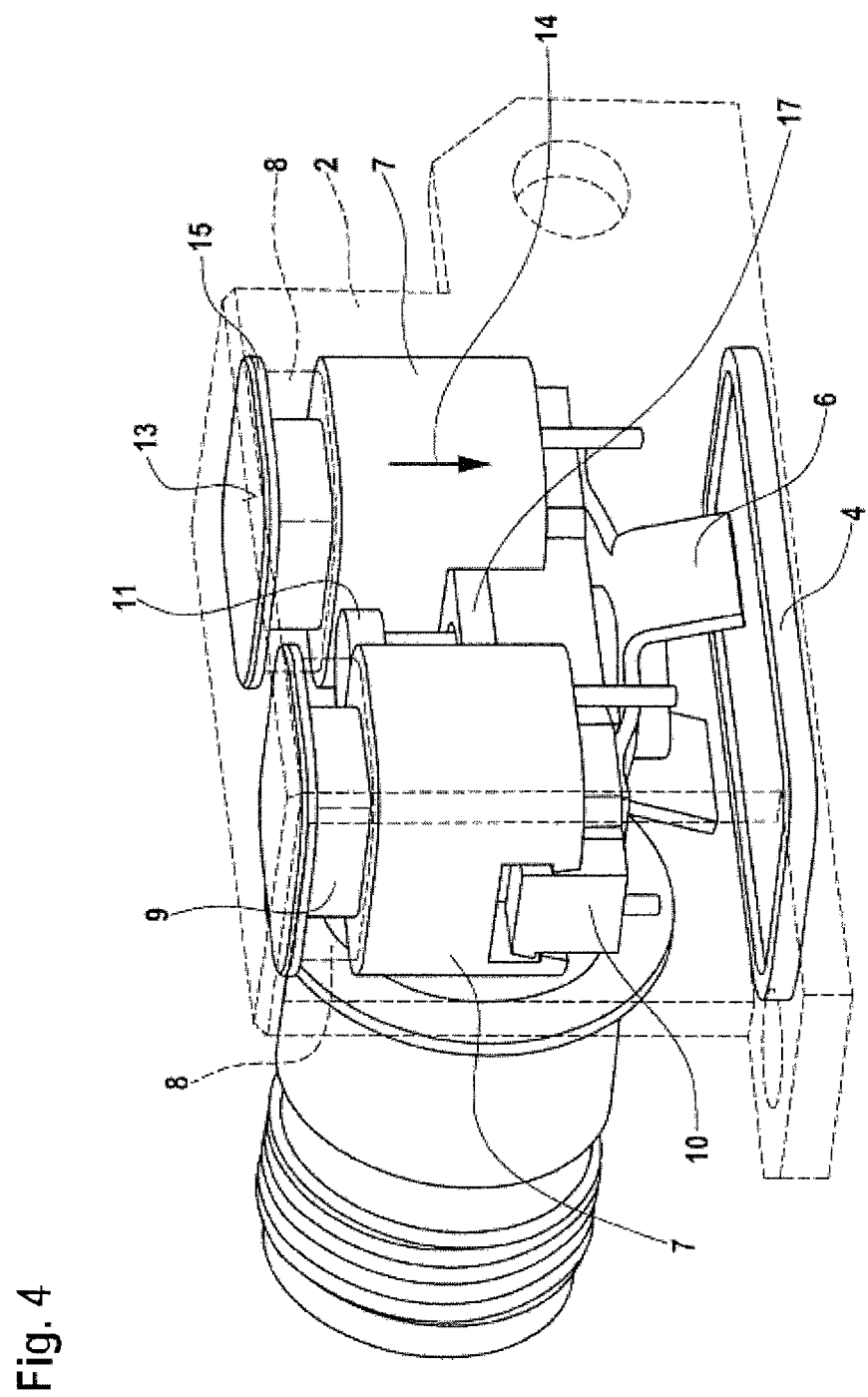
Figure 5:
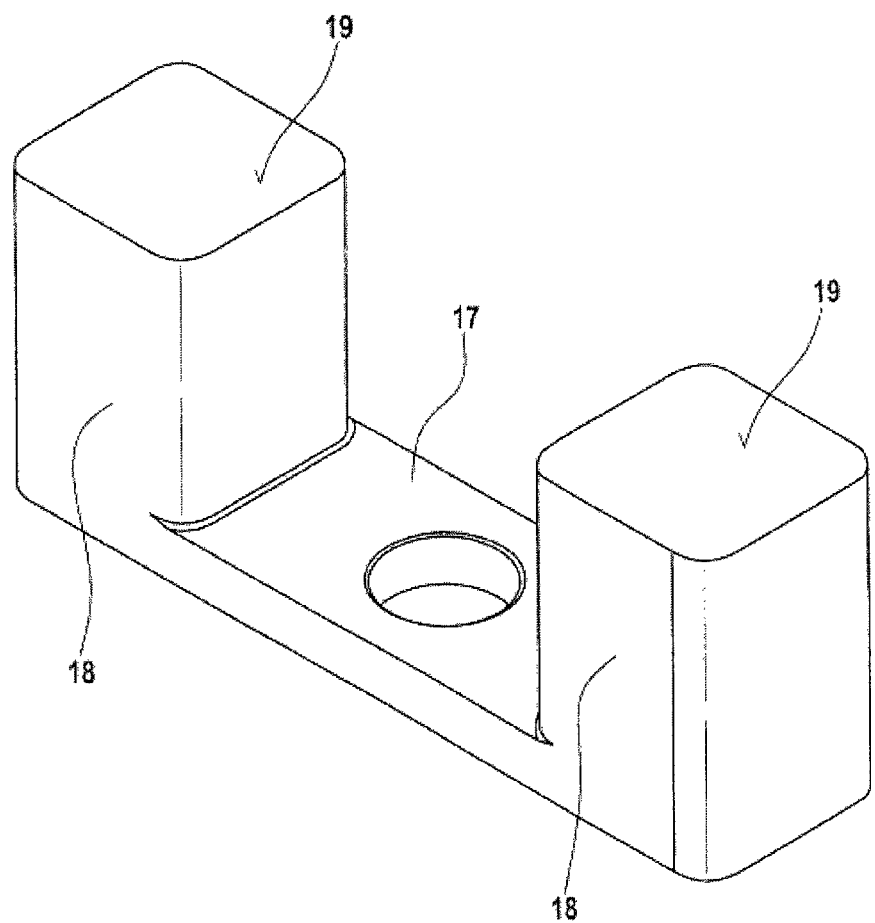
Figure 6:
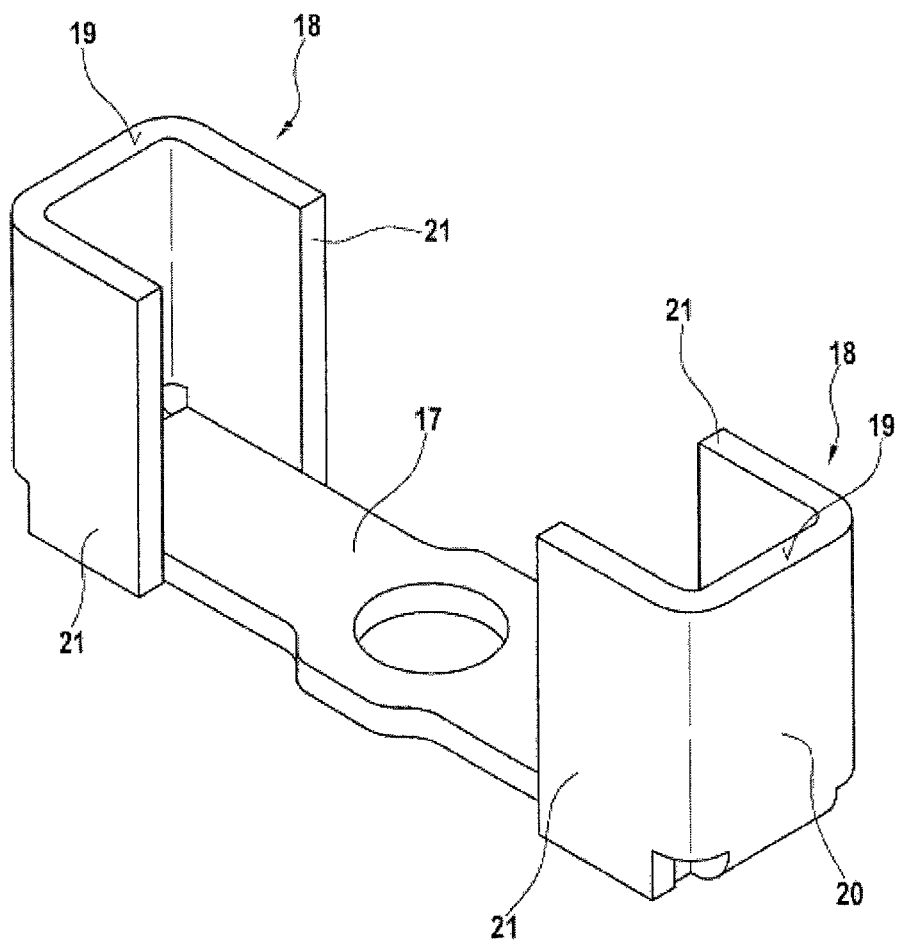
Figure 7:
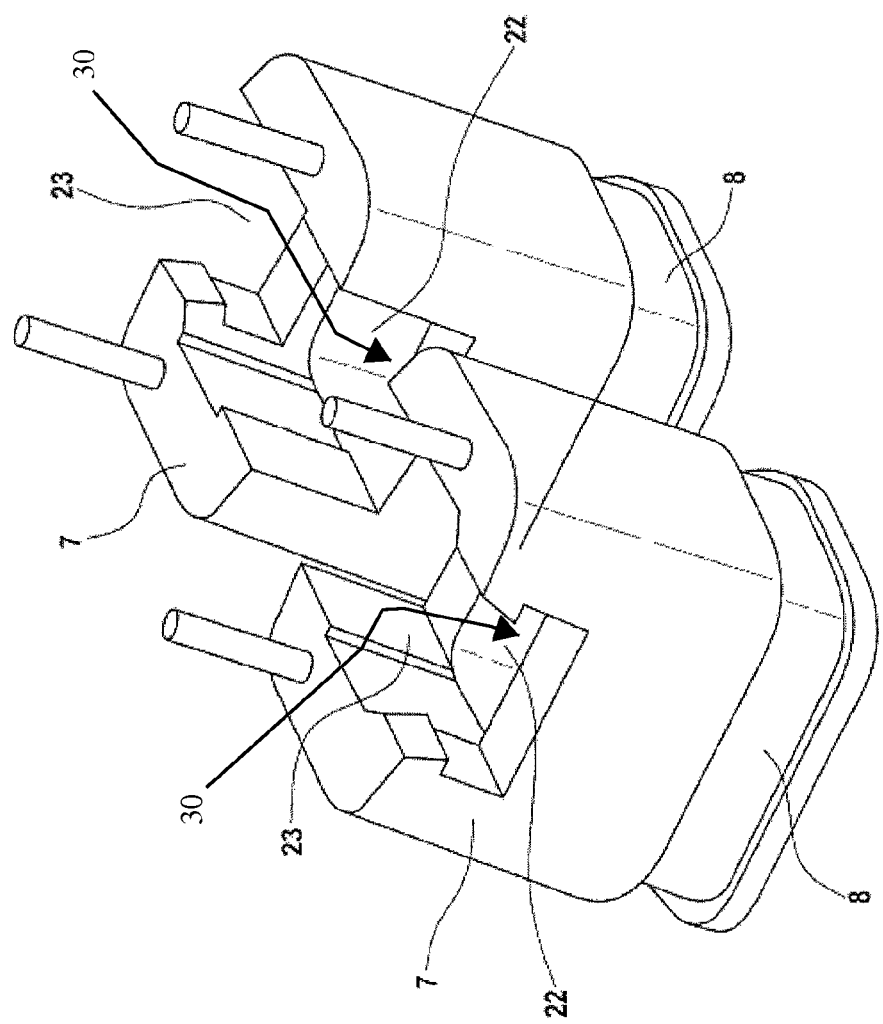
Figure 8:
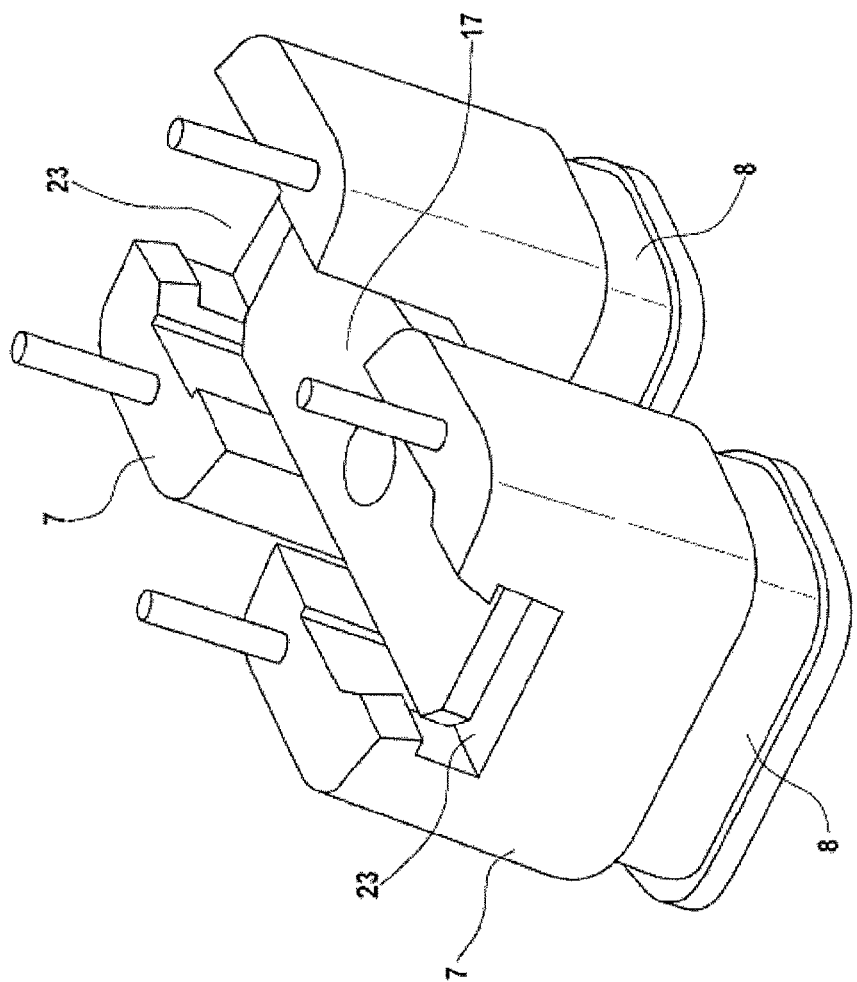
Figure 9:
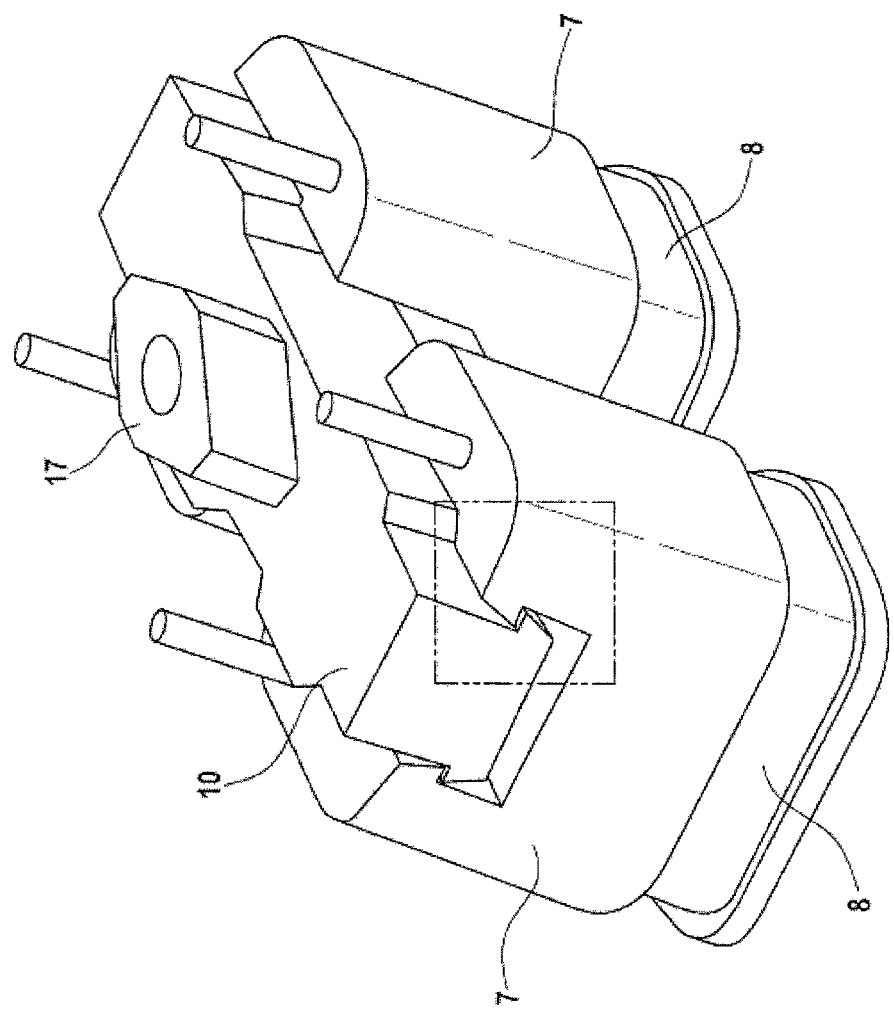
Figure 10:
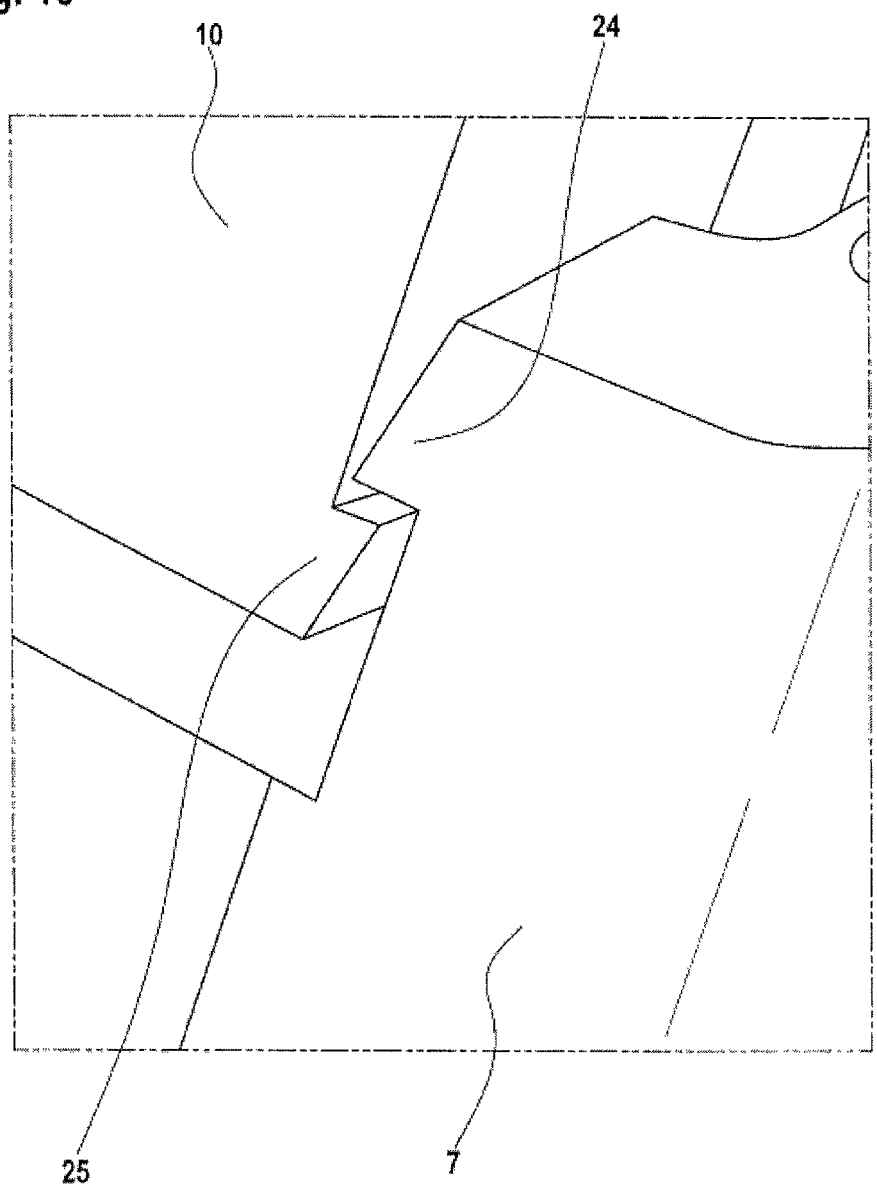

Exemplary embodiments of the invention are described in more detail below using the enclosed drawings, in which:

FIG. 1 shows an exploded illustration of a sensor;
FIG. 2 shows a first sectional view of the sensor;
FIG. 3 shows a second sectional view of the sensor;
FIG. 4 shows the sensor in the assembled state;
FIG. 5 shows a first embodiment of the core; and
FIG. 6 shows a second embodiment of the core;
FIG. 7 shows two coil carriers of the proximity sensor;
FIG. 8 shows the coil carriers with a core;
FIG. 9 shows the coil carriers with a core and a holding element; and
FIG. 10 shows a detail of the coil carrier and holding element.

In the figures, identical or functionally identical elements are denoted using identical reference symbols throughout. The figures are not necessarily true to scale and scales between individual figures may vary. Furthermore, a sensor shown in the figures as a proximity or distance sensor is at least described only to the extent needed to understand the invention. The proximity or distance sensor may generally have further elements which are not described or mentioned in any more detail below.

FIG. 1 shows an exploded illustration of a proximity or distance sensor 1 which is referred to as a proximity sensor 1 below. The proximity sensor 1 comprises a housing having a housing cover 2 and a housing bottom 4 which can be inserted into a bottom opening 3 in the housing cover 2.

An inductive sensor unit 5 and a spring 6, which applies a spring force to the sensor unit 5, are accommodated in the housing.

The sensor unit 5 comprises two coil carriers 7 each with a coil winding 8. The sensor unit 5 also comprises a U-shaped core 9, that is to say a U-core 9, and a holding element 10. The U-core 9 is held on the coil carriers 7 by means of the holding element 10. The sensor unit 5 also comprises a calibration screw 11 which can be screwed into the holding element 10.

FIGS. 2 and 3 show sectional views of the proximity sensor 1. As is clear from FIGS. 2 and 3, the spring 6 is of curved design and is supported, at its ends, on housing projections 12 of opposite inner sides of the housing cover 2.

The spring 6 directly applies a spring force to the holding element 10 and indirectly applies a spring force to the sensor unit 5 in such a manner that the sensor unit 5, more precisely the coil carriers 7, is/are pressed into the housing cover 2. More precisely, upper end faces 13 of the coil carriers 7 are pressed against the housing cover 2 on the inside, which is also clear, in particular, from FIG. 3 and from FIG. 4 which shows the proximity sensor 1 in the assembled state.

It is also clear, in particular from FIGS. 2 to 4, that the coil winding 8 extends in the axial direction 14 directly adjacent to an axial flange 15 situated at the end. The coil carrier 7 has a circumferential depression 40, in which the coil winding 8 is accommodated, adjoining the axial flange 15 in the axial direction. The coil winding 8 rests directly against the axial flange 15 which thus forms a first axial contact surface 16 for the coil winding 8.

The U-core 9, more precisely two limbs 18 projecting from a base 17 of the U-core 9, is/are inserted into respective recesses 22 in the coil carriers 7. The limbs 18 are approximately concentric in the recesses and overlap the respective coil winding 8 in the region of the circumferential depression. The limbs 18 preferably substantially completely fill the recesses 22.

The limbs 18, more precisely limb end faces 19 of the limbs 18 which point in the direction of the upper end face 13 of the coil carrier 7, rest against second axial contact surfaces 30 in the recesses 22, which contact surfaces are each substantially coplanar with respect to the first axial contact surfaces 16. The second axial contact surfaces are formed by the bottoms of the recesses 22 and lie substantially in a plane with the first axial contact surface 16. In other words, the recesses 22 extend to the plane in which the first axial contact surface 16 lies. This results in the relative position of the upper edges, that is to say the edges facing the first axial contact surface 16 and the second axial contact surface, of the limbs 18 and coil windings 8 always being at the same level. A particularly accurate and exact method of operation can thus be achieved substantially independently of temperature-induced changes in the length of the coil carrier 7 and the limbs 18 etc.

FIG. 5 shows a first embodiment of the U-core 9. It can be seen therefrom that the limbs 18 are at ends of the base 17, which are remote from one another, and project from the base 17 in the same direction. In the present example, the limbs 18 have a rectangular cross-sectional profile over their entire length, that is to say a rectangular axial section. In the present example, upon closer consideration, the axial section is in the form of a square with rounded corners, which is intended to be understood as meaning "rectangular" in the sense of the invention, in particular.

The U-core 9, in particular the limbs 18, is/are produced from solid material in the example in FIG. 5, that is to say the axial profile or cross-sectional profile is a solid profile. Cores of this type can be produced from solid material, in particular.

FIG. 6 shows a second embodiment of the U-core 9. In contrast to the U-core in FIG. 5, the axial profile of the limbs 18 in FIG. 6 is an open hollow profile. The hollow profile is specifically a U-profile. The U-profile is formed by a secondary base 20 and two secondary limbs 21 which laterally rest against the base 17 in the lower region, that is to say in the region of the feet of the limbs 21. In the present case, the openings in the U-profiles of the two limbs 18 face one another.

Such a U-core 9 with an open hollow profile can be produced, for example, by means of material forming from a sheet metal-like planar preform. The preform itself may be produced, for example, by means of stamping, cutting, in particular laser cutting, and other methods.

A hole approximately in the centre of the base 17 is provided for the passage of the calibration screw 11. The base 17 of the U-core 9 shown in FIG. 6 is laterally widened in the region of the hole, as a result of which increased mechanical stability can be achieved. The widening is designed in such a manner that the widening webs do not laterally project beyond the level of the secondary limbs 21.

It has been shown that a particularly high degree of sensitivity, accuracy and reliability can be achieved, in particular, with the U-cores 9 described above.

The assembly and structure of the proximity sensor 1, more specifically of the sensor unit 5, are discussed in more detail below, in particular with regard to FIGS. 7 to 10.

FIG. 7 shows, by way of example, two coil carriers 7 of the proximity sensor 1, more specifically of the sensor unit 5. As already mentioned, the coil carriers 7 have rectangular recesses 22 which correspond to the shape of the limbs 18, are axially approximately in the centre and into which the limbs 18 of the U-core 9 are or have been inserted. The coil carriers 7 also each have an incision 23 which runs transversely with respect to the axial direction 14 and, as stated in yet more detail further below, is relevant in connection with the fixing of the U-core 9 to the coil carriers 7.

The axial depth of the recesses 22 and the length of the limbs 18 or the length of those sections of the limbs 18 which project beyond the base 17 are adapted to one another in such a manner that the limb end faces 19 rest against the second axial contact surfaces which are coplanar with respect to the first axial contact surfaces 16.

FIG. 8 shows the coil carriers 7 with an inserted U-core 9. As can be seen in FIG. 8, the incisions 23 have a depth, in the axial direction 14, which is greater than the thickness of the base 17. The base 17 thus does not completely fill the height of the incisions 23, with the result that space for the holding element 10 remains above the base 17.

FIG. 9 shows the coil carriers 7 with an inserted U-core 9 and a holding element 10. The holding element 10 is inserted into the incisions 23. The coil carriers 7 and the holding element 10 are detachably connected to one another, are latched to one another by means of latching elements in the present case. The holding element 10, the incisions 23 and the latching elements are designed and set up in such a manner that, when the holding element 10 is latched, the U-core 9 and the coil carriers 7 are pressed onto one another. In this manner, the limb end faces 19 are pressed onto the second axial contact surface.

The latching between the coil carrier 7 and the holding element 10 is illustrated in detail in FIG. 10 which shows the section marked in FIG. 9 on an enlarged scale. As latching elements, the coil carriers 7 have first latching lugs 24 and the holding element 10 has corresponding second latching lugs 25 which latch to one another when the holding element 10 is inserted.

The coil carriers 7, in particular the incisions 23, the holding element 10 and the first latching lugs 24 and second latching lugs 25 are designed and arranged in such a manner that the U-core 9 lies between the coil carriers 7 and the holding element 10 without play and in such a manner that the limb end faces 19 always at least rest on the second axial contact surface, and are preferably pressed onto the second axial contact surfaces. As a result, the relative position of those edges of the coil windings 8 which face the first axial contact surface 16 and the second axial contact surface and the U-cores 9 remains constant, in particular in the event of changes in the length of the components of the proximity sensor 1 or the sensor unit 5 which are caused by temperature fluctuations. This makes it possible to significantly improve the accuracy and reliability of the proximity sensor 1.

The coil carrier and the holding element 10 are preferably produced from a plastic material, for example PEEK. In this case in particular, an elastic force which presses the U-core 9 in the direction of the second axial contact surface can be generated by the snap-action connection between the coil carriers 7 and the holding element 10. Elastic forces are advantageous for the already mentioned changes in the length of the components of the proximity sensor 1 in the event of temperature fluctuations since the situation in which the U-core 9 is pressed in the direction of the second axial contact surface can always be achieved, despite different coefficients of thermal expansion of the coil carriers 7 and U-cores 9.

So that the upper end faces 13 of the sensor unit 5, more precisely of the coil carriers 7, always rest against the corresponding housing inner wall, the sensor unit 5 is pressed in the direction of the housing inner wall by means of the spring 6, that is to say by means of an elastic force, as is clear from FIGS. 1 to 4, in particular. This force also acts, in addition to and in support of the force acting as a result of the holding element 10 between the U-core 9 and the coil carrier 7, to the effect that the limb end faces 19 are pressed against the second axial contact surface. In addition, the sensor unit 5 is adequately fixed in the housing by means of this force. In particular, it is also possible to ensure, in the event of temperature-induced changes in the length of the sensor unit 5 and the housing, that the sensor unit 5 always rests against the housing inner wall and the limb end faces 19 always rest against the second axial contact surface in the axial direction 14 without a gap and without play.

Overall, it is shown that the object on which the invention is based is achieved with the proximity sensor 1 in particular and generally with the sensor, in particular by means of the structure and geometry of the sensor and its individual components.

LIST OF REFERENCE SYMBOLS

1 Proximity sensor
2 Housing cover
3 Bottom opening
4 Housing bottom
5 Sensor unit
6 Spring
7 Coil carrier
8 Coil winding
9 U-core
10 Holding element
11 Calibration screw 12 Housing projection
13 Upper end face
14 Axial direction
15 Axial flange
16 First axial contact surface
17 Base
18 Limb
19 Limb end face
20 Secondary base
21 Secondary limb
22 Recess
23 Incision
24 First latching lug
25 Second latching lug

The invention claimed is:

1. A sensor comprising an inductive sensor unit extending in an axial direction, the inductive sensor unit comprising:
at least one coil carrier, the coil carrier comprising a flange at an axial end of the coil carrier, the coil carrier defining a circumferential depression that is recessed from an outer circumference of the coil carrier, the flange and the circumferential depression together defining a first axial contact surface and a second axial contact surface of the coil carrier, the first axial contact surface and the second axial contact surface being axially opposite each other,
a coil winding situated in the circumferential depression for generating a magnetic field, the coil winding extending in the axial direction to adjoin the flange, wherein the coil winding extends between the first axial contact surface and the second axial contact surface and rests directly against the first axial contact surface and the second axial contact surface, and
at least one core,
wherein the core is at least partially arranged in a recess in the coil carrier in a concentric manner and in such a manner that the core overlaps the coil winding, and
wherein the core rests against a third axial contact surface which is coplanar with the first axial contact surface, and at least one core section of the core, which overlaps the coil winding, comprises a rectangular cross-sectional profile.

2. The sensor according to claim 1, wherein the cross-sectional profile of at least one core section comprises a solid profile.

3. The sensor according to claim 1, wherein the cross-sectional profile of at least one core section comprises a closed or open hollow profile.

4. The sensor according to claim 1, wherein the core is pressed in the direction of the second axial contact surface by a force.

5. The sensor according to claim 4, wherein said force is an elastic force.

6. The sensor according to claim 5, wherein said elastic force is a spring force.

7. The sensor according to claim 1, wherein the core is designed as a U-core with two limbs and a base connecting the limbs, each limb being at least partially arranged in a recess in a respective coil carrier, in such a manner that the core overlaps the coil winding.

8. The sensor according to claim 7, wherein ends of the limbs which face away from the base are pressed onto respective second axial contact surfaces.

9. The sensor according to claim 8, wherein said ends of the limbs are pressed onto said respective second axial contact surfaces by applying a force to the base.

10. The sensor according to claim 7, wherein a force which presses the core or the limbs into respective recesses and/or presses the sensor unit in the direction of the inner wall of a housing of the sensor is generated by the holding element and/or by an elastic force which is applied to the holding element.

11. The sensor according to claim 10, wherein said elastic force is a spring force which presses the holding element against the at least one coil carrier.

12. The sensor according to claim 7, wherein the at least one coil carrier has an axial end face which faces away from the recess.

13. The sensor according to claim 12, wherein the axial end face of the at least one coil carrier is pressed against an inner wall of the housing by the spring.

14. The sensor according to claim 7, wherein each limb is arranged in a concentric manner.

15. The sensor according to claim 1, wherein the core is held using a holding element which can be detachably connected to the at least one coil carrier.

16. The sensor according to claim 15, wherein said holding element is latched to the at least one coil carrier.

17. The sensor according to claim 1, further comprising a spring which applies a spring force to the holding element.

18. The sensor according to claim 1, further comprising a housing in which the at least one coil carrier and the core are accommodated, the spring supported on the holding element, on the one hand, and on the housing, on the other hand.

* * * * *